United States Patent [19]

Chau et al.

[11] Patent Number: 5,200,963
[45] Date of Patent: Apr. 6, 1993

[54] SELF-CHECKING ON-LINE TESTABLE STATIC RAM

[75] Inventors: Savio N. Chau, Hacienda Heights; David A. Rennels, La Canada, both of Calif.

[73] Assignee: The United States of America as represented by the Administrator, National Aeronautics and Space Administration, Washington, D.C.

[21] Appl. No.: 543,915

[22] Filed: Jun. 26, 1990

[51] Int. Cl.⁵ ............................................. G06F 15/40
[52] U.S. Cl. ............................... 371/68.1; 371/67.1; 365/131
[58] Field of Search ............... 371/68.1, 67.1, 21.1, 371/21.2, 10.1; 365/131

[56] References Cited

U.S. PATENT DOCUMENTS

| | | | |
|---|---|---|---|
| 3,544,777 | 12/1970 | Winkler | 371/68.1 |
| 3,646,516 | 2/1972 | Flinders | 371/68.1 |
| 4,426,699 | 1/1984 | Tanaka et al. | 371/68.1 |
| 4,639,919 | 1/1987 | Chang et al. | 371/27 |
| 4,744,061 | 5/1988 | Takemae et al. | 365/201 |
| 4,782,488 | 11/1988 | Anderson | 371/27 |
| 4,792,955 | 12/1988 | Johnson et al. | 371/68.1 |

*Primary Examiner*—Robert W. Beausoliel
*Assistant Examiner*—Ly V. Hua
*Attorney, Agent, or Firm*—John H. Kusmiss; Thomas H. Jones; Guy M. Miller

[57] ABSTRACT

A fault-tolerant random access memory for use in fault-tolerant computers. It comprises a plurality of memory chips each comprising a plurality of on-line testable and correctable memory cells disposed in rows and columns for holding individually addressable binary bits and provision for error detection incorporated into each memory cell for outputting an error signal whenever a transient error occurs therein. Each of the memory cells comprises a pair memory sub-cells for simultaneously receiving and holding a common binary data bit written to the memory cell and the error detection provision comprises comparator logic for continuously sensing and comparing the contents of the memory sub-cells to one another and for outputting the error signal whenever the contents do not match. In accordance with one feature of the invention, the memory systematically searches for an error in response to an error signal and corrects the error found by the search.

19 Claims, 5 Drawing Sheets

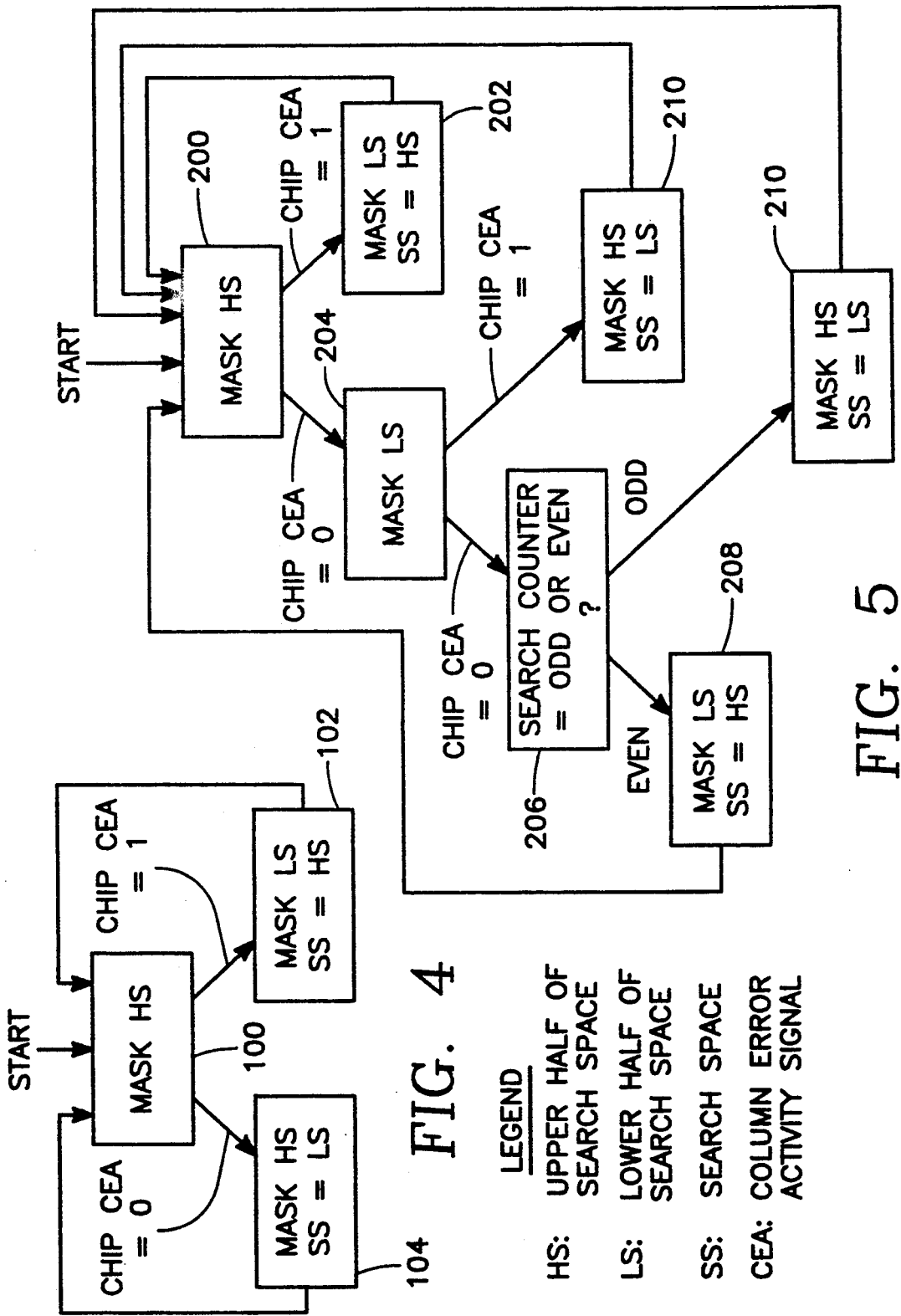

SELF-CHECKING ON-LINE TESTABLE STATIC RAM

ORIGIN ON THE INVENTION

The invention described herein was made in the performance of work under a NASA contract, and is subject to the provisions of Public Law 96-517 (35 USC 202) in which the Contractor has elected not to retain title.

TECHNICAL FIELD

The invention relates to computer memories and, more particularly, to a fault-tolerant random access memory for use in fault-tolerant computers comprising a plurality of memory chips.

BACKGROUND ART

In the field of digital computers, so-called fault tolerance is an important aspect where the computer is to be used in an environment where it may not be possible to gain access to the computer for maintenance purposes either because of circumstances or because of location. Thus, fault tolerance is a major factor in space and military applications. In this regard, in a fault tolerant computer system the computers, their components, the programs running in them, and the peripherals attached thereto are all provided with back-up capabilities so that any particular entities functions can be assumed by another entity in the event of failure from any source of for any reason. This typically imposes a high overhead on the system as well as additional complexity and cost; but, it is necessary in many instances. The alternative being complete system failure. As can be appreciated, this alternative is not acceptable for a multimillion dollar space probe, or the like. While non-critical functions may have to be eliminated and overall performance may degrade, the functions essential to success of the mission must be maintained.

A particularly hard portion of a digital computer to error check and correct is the memory itself. The systems and applications programs that operate in the system as well as the data they manipulate and produce is contained in random access memory (RAM). Diagnostic programs in the RAM can detect and correct or bypass other system defects. If a CPU fails to provide a proper response to a diagnostic input, its functions can be transferred to another CPU. But, how do we know that the memory is working properly, i.e. that it is reading and writing binary information without losing or picking up bits? This is an area of great concern to those working in the design of fault tolerant computers and their memories.

In many applications of fault-tolerant computer systems, such as deep space exploration or earth-orbiting satellites, a relatively long time may transpire between occurrence and detection of a fault. A fault that has occurred but not yet generated an error is referred to as a "dormant fault" and an error that has been generated by the dormant fault but not yet detected by error checking circuitry is called a "latent error". If dormant faults and latent errors are not detected and corrected promptly after they occur, multiple faults or errors can accumulate. This can jeopardize the fault recovery mechanisms in most fault-tolerant systems since they are only designed to cope with single faults. It should be noted that the effect of latent faults has been studied extensively by those skilled in the art.

It is known that classical error-detection techniques such as duplication-and-comparison, voting, error-detecting and correcting codes and self-checking logic are not capable of detecting dormant faults and latent errors. This is because these techniques cannot detect a fault unless the faulty circuit is exercised in such a way as to cause a logic error to appear at a checking circuit. In normal system operation, however, the input required to exercise (i.e. trigger) the faulty circuit may not occur over a relatively long time, or not at all. One way to detect these faults is to suspend system operation and check all data and components. This approach, of course, causes prolonged interruption of normal system operation and may not be used for many applications, such as real-time systems. Other approaches to alleviate the dormant fault problem is to increase resiliency against multiple faults by increasing redundancy (e.g., by using a 3-out-of-5 system) or by employing multiple error-correcting codes. Unfortunately, these techniques require large hardware overhead and do not solve the fundamental problem of exposing these error and fault conditions quickly.

Prior art Self-Exercising (SE) techniques of the inventors herein can detect the presence of dormant faults and latent errors shortly after their occurrence while normal system operation is in progress. These techniques first enhance the testability of major system components (memory, data path, control circuitry, etc.) in a fault-tolerant system by augmenting their internal logic structure. Then, test cycles to detect faults in these components are interleaved with normal system operations. Each test cycle is a small portion of the complete test of the components. Hence, these test cycles are very short and can be applied at a relatively high rate (e.g., once every 100 $\mu$sec) without causing observable interruption to normal system operation. Since the components are designed to be highly testable, a complete test only requires a small number of test cycles (e.g., approximately 100 for non-large systems). Thus, in a self-exercising system the maximum error latency, which is by definition the time required to perform the complete test, is also small. Self-exercising design has many applications, especially in those environments where high transient fault rate is expected, such as planetary explorations and some military applications.

While the above-described self-exercising technique has advantages as described, it also has certain drawbacks as well. First, although normal system operation is not interrupted, fault detection by self-exercising does cause a few percent performance degradation. Second, isolation of a latent error after it is detected requires fairly lengthy procedures. The self-exercising techniques have to suspend system operation in order to isolate or locate the error. This may not be acceptable if system operation is time critical. Besides, if the transient fault arrival rate is high, significant performance may be lost due to the fault isolation. Third, when multiple latent errors occur, the above self-exercising techniques are either unable to isolate each individual error or fail to detect the occurrence of multiple errors entirely. Thus, the probability of survival of such systems would decrease rapidly if the transient fault arrival rate is very high.

What is required, therefore, is a memory system design which can detect latent errors instantly without the need of explicit test. Then, the isolation of detected errors can be done simultaneously with the normal operations. Furthermore, it should detect and isolate and thus correct most of multiple latent errors.

SUMMARY OF THE INVENTION

Accordingly, it is an object of this invention to provide a self-checking memory design which employs duplication-and-comparison at the memory cell level so that latent errors can be detected instantly.

It is another object of this invention to provide a self-checking memory design in which by controlling comparators at each cell, errors can be located while normal memory reads and writes are in progress so that no system performance is lost due to isolation of the latent errors.

It is still another object of this invention to provide a self-checking memory design in which a latent error will be corrected in O(log N) cycles after its occurrence, where N is the memory size.

It is yet another object of this invention to provide a self-checking memory design in which with additional on-chip and off-chip parity bits, most of multiple latent errors can also be identified and corrected.

Other objects and benefits of this invention will become apparent from the detailed description which follows hereinafter when taken in conjunction with the drawing figures which accompany it.

The invention is a digital memory chip for use in random access memory for fault-tolerant computers which include a plurality of on-line testable and correctable memory cells for holding individually addressable binary bits and error detection device incorporated into each memory cell for outputting an error signal whenever a transient error occurs therein. In one embodiment, each of the memory cells includes a pair of static memory sub-cells for simultaneously receiving and holding a common binary data bit written to the memory cell, and the error detection device includes a comparator device for continuously sensing and comparing the contents of the memory sub-cells to one another, and for outputting the error signal whenever the contents do not match. In another embodiment, each of the memory cells includes a static memory sub-cell and a dynamic memory sub-cell for simultaneously receiving and holding a common binary data bit written to the memory cell, and the error detection device includes a comparator device for continuously sensing and comparing the contents of the static memory sub-cell to the dynamic memory sub-cell and for outputting the error signal whenever the contents do not match. In yet another embodiment, the memory chip further includes a comparator disable control circuit device connected to the error detection device in respective ones of the memory cells for selectively enabling and disabling the error detection device. In this latter embodiment, each of the error detection device is enabled and disabled by a binary mask word having bit positions thereof corresponding to respective ones of the error detection device, and the comparator disable control circuit device includes device for setting the binary mask word to desired configurations. In one variation of this embodiment, the memory chip is part of a fault-tolerant computer memory having a plurality of the chips and additionally includes a fault detecting logic device connected to respective ones of the memory chips receiving the error signal, for executing an error-isolating algorithm upon receiving a the error signal, and for outputting control signals affecting the content of the mask word, and the device for setting the binary mask word to desired configurations includes a device connected to receive the control signals and for setting the binary mask word to configurations indicated by the control signals. In a preferred embodiment, the fault detecting logic device includes fault correcting logic device for monitoring results of the error-isolating algorithm to determine when and where a error resulting in a the error signal is located and for outputting correction signals to the memory chip containing the error therein thereby affecting correction of the error on the memory cell level. Preferably, the fault correcting logic device monitors results of the error-isolating algorithm to determine when and where multiple errors on a single the memory chip resulting in a the error signal are located and for removing erroneous data from the memory chip containing the error therein, for correcting the erroneous data, and for replacing the erroneous data as corrected from the memory chip. In one version, the error-isolating algorithm is driven by changes of the error signals, and the memory chip additionally includes a plurality of first combining devices connected to receive the error signals from respective ones of the memory cells in a column of a memory chip for outputting a column error activity (CEA) signal whenever one of the error signals is present in the column associated with a one of the first combing device and a plurality of second combining devices connected to receive CEA error signals from respective ones of the plurality of first combining device for outputting a signal chip CEA signal whenever one of the CEA signals is present on the memory chip associated with a one of the second combining device. In this latter embodiment, the error-isolating algorithm includes logic for performing the steps of (1) designating a portion of the memory chip where the comparators are enabled as search space (SS), an upper half of the search space as HS and a lower half as LS, (2) at a beginning of a search, allocating SS as the entire memory chip, (3) at a beginning of fault isolation, masking HS, (4) if the chip CEA signal becomes high (i.e. CES changes from active to inactive) then the error should be in HS, if HS is bigger than one column, masking LS, allocating HS as SS, and returning to step (3), otherwise going to step (6), (5) if the chip CEA signal is low (i.e. CES remains active) then the error should be in LS, if LS is bigger than one column, masking HS, allocating LS as SS, and returning to step (3), otherwise going to step (6), (6) exiting as the column on the memory chip containing the error has been isolated. Preferably, the digital memory chip additionally includes a counter device for counting error corrections made, and the error-isolating algorithm includes non-preferential logic to at step (3) thereof first masking HS if the counter device is odd and first masking LS if the counter device is even and at step (6) thereof increment the counter device by one whereby preferential error isolation in either HS or LS is prevented.

BRIEF DESCRIPTION OF THE DRAWINGS:

FIG. 4 a simplified drawing depicting a search algorithm employed in the present invention to isolate a fault.

FIG. 5 a simplified drawing depicting another search algorithm employed in the present invention to isolate a fault.

DETAILED DESCRIPTION OF THE INVENTION

Figure 1:
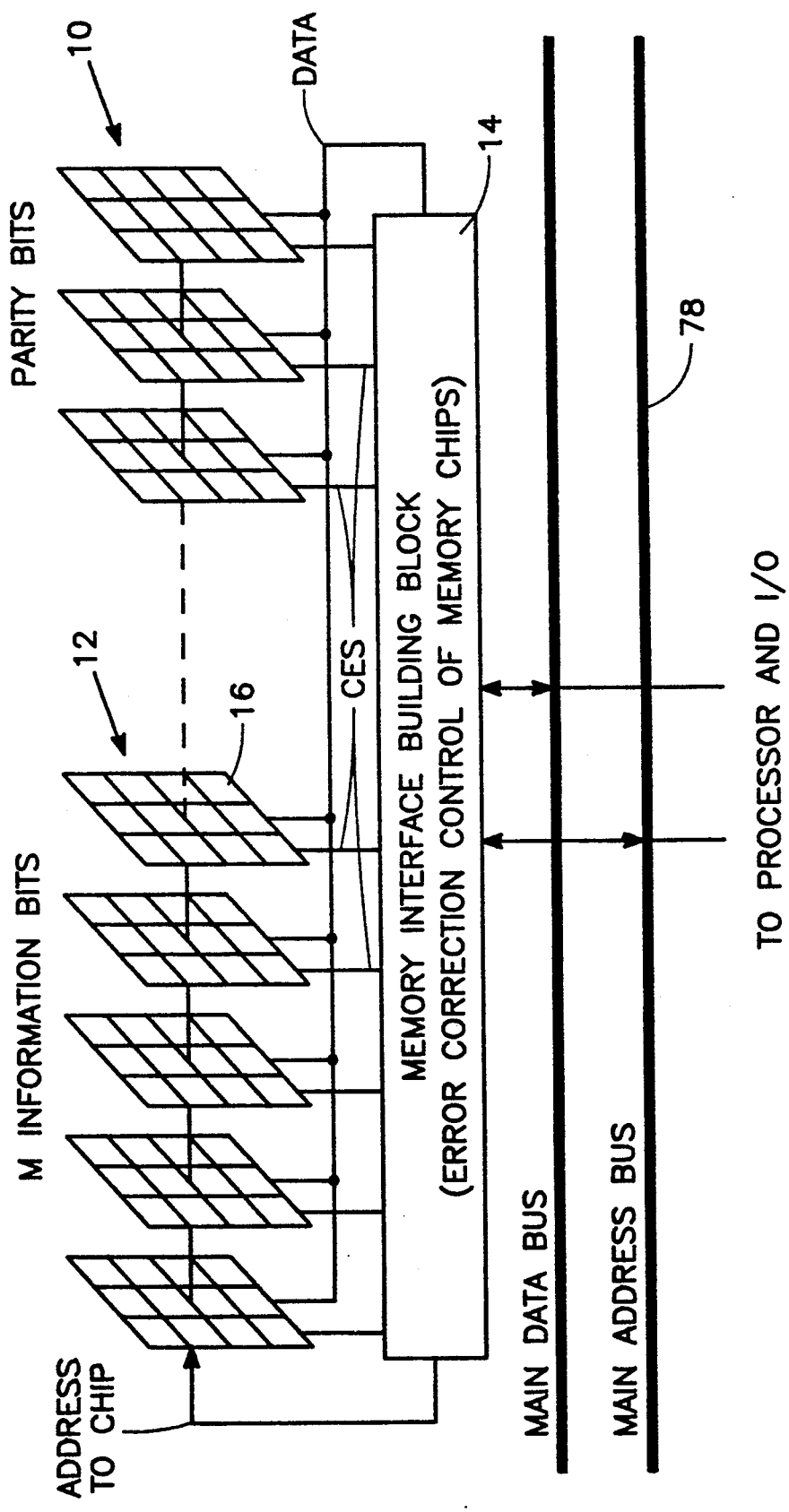
FIG. 1 is a simplified drawing depicting a computer memory according to the present invention.

The memory system of the present invention will be referred to for convenience hereinafter as a self-checking, self-recovering (SC/SR) memory. The SC/SR of this invention is applicable to memory systems similar to prior art self-exercising, self-checking memories. Such memory systems employ individual memory chips organized as N on-bit words. The memory chips contain N×1 Mbits. The memory system is structured to contain M+P bit words, with M information bits and P parity bits to implement a Hamming SEC/DED code. Each bit position in all words is stored in separate chips so that any single chip failure will at most damage one bit in any word. A simplified drawing of such a memory system implementing the SC/SR of this invention is shown in FIG. 1 where it is generally indicated as 10. In addition to the RAM memory chips 12, a Memory Interface Building Block (MIBB) 14 circuit is used for control and to provide Hamming Code encoding, decoding, and single error correction. If a single error is found in a word being read out, the MIBB 14 corrects the error and stores the corrected value back to the memory chip 12. Such MIBBs are, in general, known in the prior art and, for example, one developed at the Jet Propulsion Laboratory in Pasadena, Calif. can also substitute spare bit planes (i.e. memory chips 12) for ones that have failed. For the SC/SR 10 of this invention, the MIBB 14 is also responsible for detecting, isolating, and correcting the latent errors. This aspect is, of course, not known in the prior art and is a major point of novelty of the present invention which will be addressed in greater detail shortly.

In the SC/SR 10, the memory cells 16 of a memory chip 12 are assumed organized in a two-dimensional array. During a memory read operation, the upper half of the address (the "row" address) selects a row and the lower half of the address (the "column" address) selects a bit in the row for output. Similarly, during a memory write operation, the row address first reads out a row1 then, the column address selects a bit in the row and replaces it with the input data bit. The modified row is then written back into the memory cell array of the memory chip 12.

In the SC/SR 10, the memory cells 16 of a memory chip 12 also include parity bits within the cell array. These parity bits can be used for self-exercising as in the prior art approach described above. Additionally, however, they can be used to correct transient errors in the cell array in a manner to be described shortly. The update of the parity bit is similar to the self-checking self-exercising memory; that is, during a memory write operation the selected data is compared with the input data bit before it is updated. If the values are different, the parity bit is inverted; otherwise, it is unchanged. Both the data bits and the parity bits are reset to 0 during power-up. In the SC/SR 10, it is assumed also that the memory cells 16 are static. Two alternate memory cell designs to achieve instant latent error detection and transparent error isolation will now be described in detail.

Figure 2:
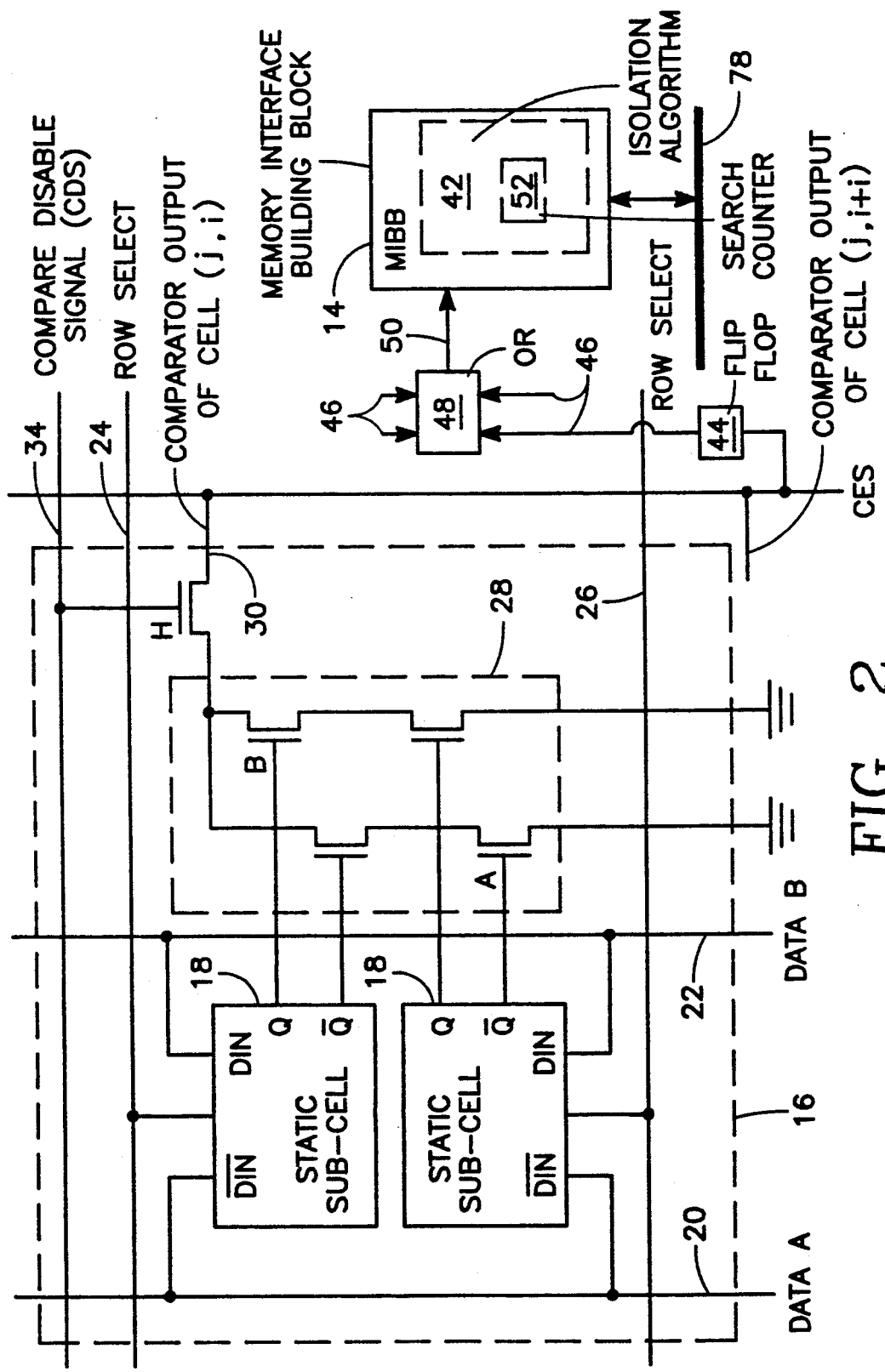
FIG. 2 a simplified drawing depicting a computer memory cell according to the present invention in a first embodiment comprising two static sub-cells.

In the first design as depicted in FIG. 2, each memory cell 16 consists of two identical static sub-cells 18. Since data input to each sub-cell 18 has both true and complement bit lines and is thus self-checking, both sub-cells 18 can share the data input lines DATA A 20 and DATA B 22. On the other hand, the cell select lines 24 and 26 are separate to ensure independence. Instant latent fault detection is achieved by comparing the static sub-cells 18 employing an in-cell comparator 28 which operates in a manner well understood by those skilled in the art. The comparator output 30 of all memory cells 16 in a column are wire-OR'd together to form a Column Error Signal (CES) on line 32. The comparator outputs 30 of all memory cells 16 in a row can be disabled by a common Comparator Disable Signal (CDS) on line 34. Thus, in the memory cells 16 of the SC/SR 10, each column has a CES 32 and each row has a CDS line 34.

Whenever a transient error occurs in one of the sub-cells 18 and the sub-cell 18 is not being selected for memory write, the comparator 28 in the memory cell 16 detects the difference between the two sub-cells 18 and immediately activates the CES line 32. The activated CES line 32 is input to the MIBB 14 and signals it to initiate an error isolation procedure using a binary search scheme. In this scheme, the comparators 28 in the rows of the upper half of the memory chip 12 are first disabled by the CDS's 34 and the comparators 28 of the lower half rows remain enabled. If the erroneous cell is located in the upper half of the memory chip 12, the activated CES 32 will be deactivated because its comparator is disabled. On the other hand, if the erroneous cell is in the lower half of the memory chip 12, the activated CES 32 will remain active. Assuming the CES 32 is still active after the first step, then the next step is to enable the comparators 28 in the rows of the lower half of the lower half (i.e. the last quarter) of the memory chip 12 and disable the comparators 28 in the other parts of the memory chip 12. If the CES 32 is deactivated this time, then the comparators 28 of rows in the upper quarter are enabled and the comparators 28 of rows in the last quarter (i.e. the lower half of the upper half rows) are disabled. This search is applied recursively until only a single row is enabled and its CES 32 is active. Then, the row is read out for error correction. Assuming the cell array of the memory chip 12 is square, the total time to isolate any error is approximately $O(\log N)$, where N is the number of bits in the memory chip 12.

Having thus detected and isolated an error, the correction thereof is done as follows. First, the upper sub-cells 18 of the faulty row are read out and parity check is performed. If parity error is found, the data bits associated with an active CES 32 is inverted and then the row of data is written back to the memory chip 12; otherwise, the lower half sub-cells 18 of the row are read out and parity check is performed once again. If none of the rows of sub-cells 18 has parity error, then a permanent fault has been found either in the CES line 32 or the comparator 28. It is also possible that two transient errors may occur in the same row of memory cells 16 thus causing two active CES signals. If both errors occur in the upper sub-cells 18 (or lower sub-cells 18), the parity check cannot determine whether the upper sub-cells 18 or lower sub-cells 18 should be inverted. In that case, the erroneous bit has to be read out of the chip and be corrected by the external Hamming Code. After the error is corrected, all comparators 28 are enabled once again.

As those skilled in the art will undoubtedly have noticed, the above-described error isolation scheme is driven by the CES signals and does not use the data bit lines (i.e. 20, 22) at all. Therefore, it can be carried out while normal read/write operations are in progress. Hence, the error isolation process is transparent to normal system operation and does not cause any performance degradation. As a matter of fact, since latent errors can be detected and isolated (and thus corrected) so easily in the SC/SR 10 of this invention, most of the transient errors can be corrected before the erroneous data is actually used. Therefore, the probability of reading an erroneous data during normal system operations is significantly reduced. Thus, the SC/SR 10 of this invention is ideal for high-performance, fault-tolerant systems employing micro-rollback techniques since the need for rollback is much less likely.

It should be noted at this point that there are dormant faults which may not be detected by the above-described approach. Examples are stuck-inactive comparator outputs, faults affecting both sub-cells and address decoding, etc. These faults are usually permanent faults, however, and thus require system level recovery actions. Such faults can be detected by the prior art self-exercising techniques described earlier herein. Since permanent fault rate is usually much lower than transient fault rate in many applications, the self-exercise can be done much less frequently in the SC/SR 10 of this invention than in the prior art memories for which it was originally designed.

Figure 3:
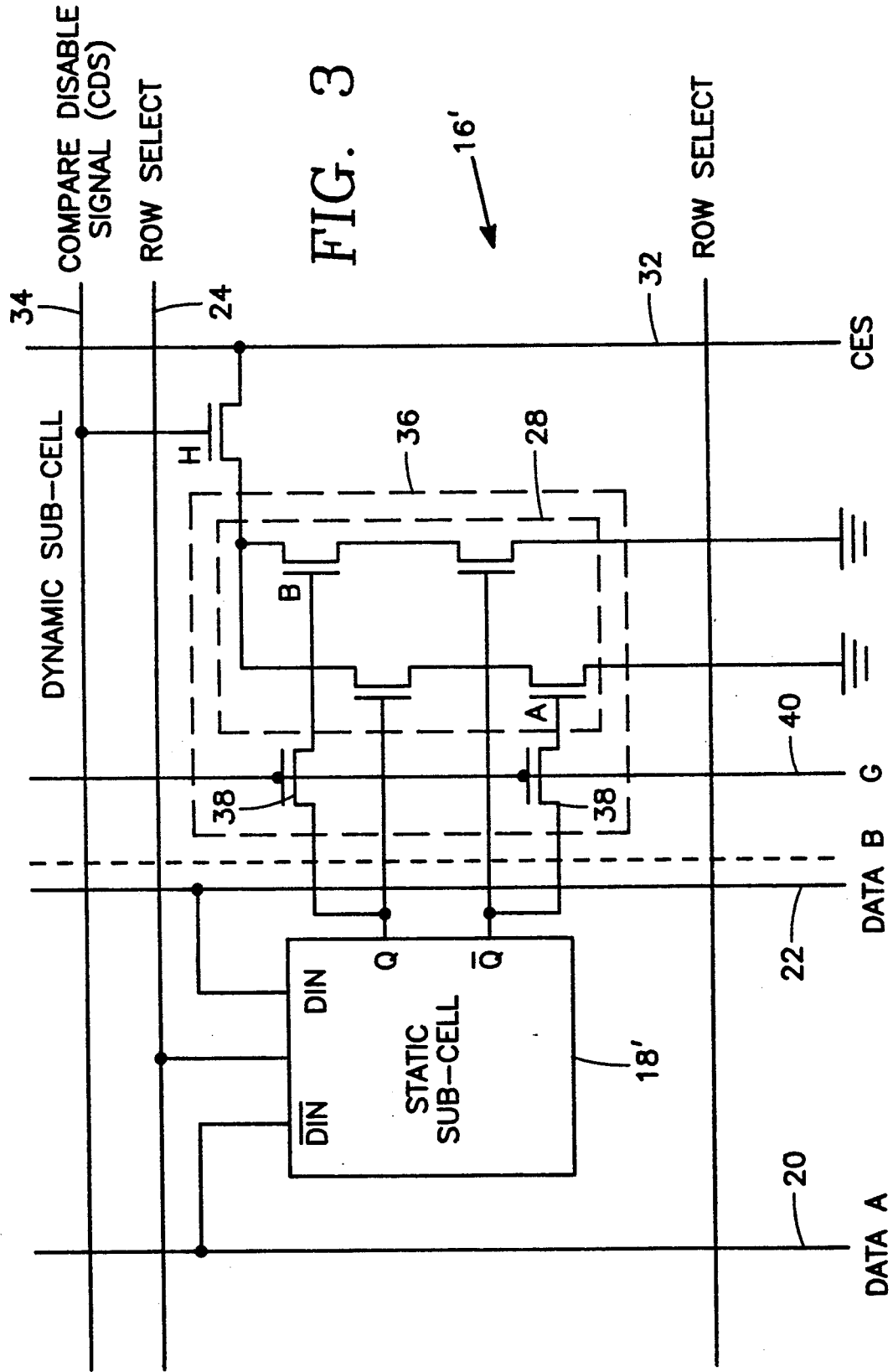
FIG. 3 a simplified drawing depicting a computer memory cell according to the present invention in a second embodiment comprising one static sub-cell and one dynamic sub-cell.

FIG. 3 shows an alternate design for the memory cells 16' the SC/SR 10 of this invention which uses a static sub-cell 18' to store data and a dynamic sub-cell 36 for checking. The dynamic sub-cell 36 consists of the comparator 28 and two pass transistors 38. When data is written into the static sub-cell 18', the pass transistors 38 are turned on (via the G input on line 40) to store the true and complement outputs of the static sub-cell 18' as charges on gates A and B of the comparator 28. Then, the pass transistors 38 are turned off so that the charges are trapped. Later on, if either one of the sub-cells 18', 36 are "flipped" as the result of a transient fault, the comparator 28 will detect the difference and activate the CES line 32.

The error isolation procedure for this memory cell design is identical to the full static cell design described above; but, the error correction procedure is slightly different. It is because only the static cell 18' can be read directly. If the error occurs in the dynamic sub-cell 36, it is possible that when the faulty row is identified and read, no parity error will be found in the data. In that case, the data is written back to the row so that the dynamic sub-cell 36 can be refreshed. If the CES disappears after that, then the error in the dynamic sub-cell 36 has been corrected; otherwise, a permanent fault has been detected. It should also be noted that this memory cell design has been layed out for VLSI implementation. It is smaller than the full static cell design of FIG. 2 and about 2.5 times larger than a conventional memory cell. It is, however, necessary to refresh the dynamic sub-cell 36 relatively frequently. The dynamic sub-cell 36 is not used to store the actual data; but, it is also more susceptible to transient error. Therefore, it may cause false alarms more than the static design of FIG. 2. Furthermore, if the static sub-cell 18' has a permanent fault, the dynamic sub-cell 36 cannot be used as a backup. Hence, this particular design is not a preferred design for the SC/SR 10 and is only suitable for applications where cost is the primary consideration.

Returning now to the error isolation scheme and with reference to FIG. 2, the error isolation algorithm 42 implemented within the MIBB 14 is driven by changes of the CES signals. A simple circuit 44 consisting of a flip/flop or XOR gate is added at the bottom of each memory cell 16 column to capture changes of the CES line 32 which is input thereto. The output 46 of the circuit 44 can therefore be designated as a Column Error Activity (CEA) signal. The CEA signals on outputs 46 are input to the MIBB 14 which observes the CEA signals in order to determine which part of the array of cell comparators 28 needs to be masked. Since there are many columns in the cell array of the SC/SR 10, however, it is impractical to dedicate one pin for each CEA. Therefore, all outputs 46 are OR'd together at 48 to provide a single "CHIP CEA" signal at 50 which is input to the MIBB 14.

If there is only one error in one memory chip 12 of the SC/SR 10, the error isolation algorithm 42 is straight forward and is as depicted in FIG. 4. For purposes of discussion, the portion of the memory chip 12 where the comparators 28 are enabled is designated as search space (SS), the upper half of the search space is designated as HS and the lower half as LS. At the beginning of the search, SS is the entire memory chip 12. At the beginning of fault isolation, HS is masked (100). If the CHIP CEA signal at 50 becomes high (i.e. CES changes from active to inactive), then the error should be in HS. Hence, LS is masked (102) and HS becomes SS in the next iteration. On the other hand, if the CHIP CEA signal at 50 is low (i.e. CES remains active), then the error should be in LS, HS is masked, (104) and LS becomes SS in the next iteration.

If there are multiple errors in the memory chip 12, the algorithm 42 inherently gives preference to correcting errors in LS over errors in HS. This preference is not desirable because in high transient fault rate environments, new transient errors may arrive before all of the previously detected errors are corrected. Hence, errors in HS may have to wait until after all the errors in LS are corrected before they can be corrected. Accordingly, the algorithm 42 in its preferred implementation is modified to prevent this problem in the manner depicted in FIG. 5. In this modified approach, if HS is masked (200) and the CHIP CEA signal at 50 becomes high, then the algorithm 42 can be sure that all errors are in HS. Thus, LS can be masked (202) and HS can be designated as the next SS. But, if the CHIP CEA signal at 50 remains low (i.e. CES is unchanged) after HS is masked, it is still possible that errors can exist in both LS and HS. Therefore, LS must also be masked 204 to determine if that is, in fact, the case. If the CHIP CEA signal at 50 becomes low after LS is masked, then the errors can only exist in LS. On the other hand, if the CHIP CEA signal at 50 remains high, then errors exist in both halves of the array of memory cells 16 that comprise the memory chip 12. In order to make the search non-preferential, a search counter 52 (see FIG. 2) is implemented within the algorithm 42 and is used (206) to decide which half of the SS should be masked at this time. For example, HS can be masked first on an even count value (208) and LS for odd (210). The search counter 52 is, of course, incremented after every error is corrected.

Figure 6:
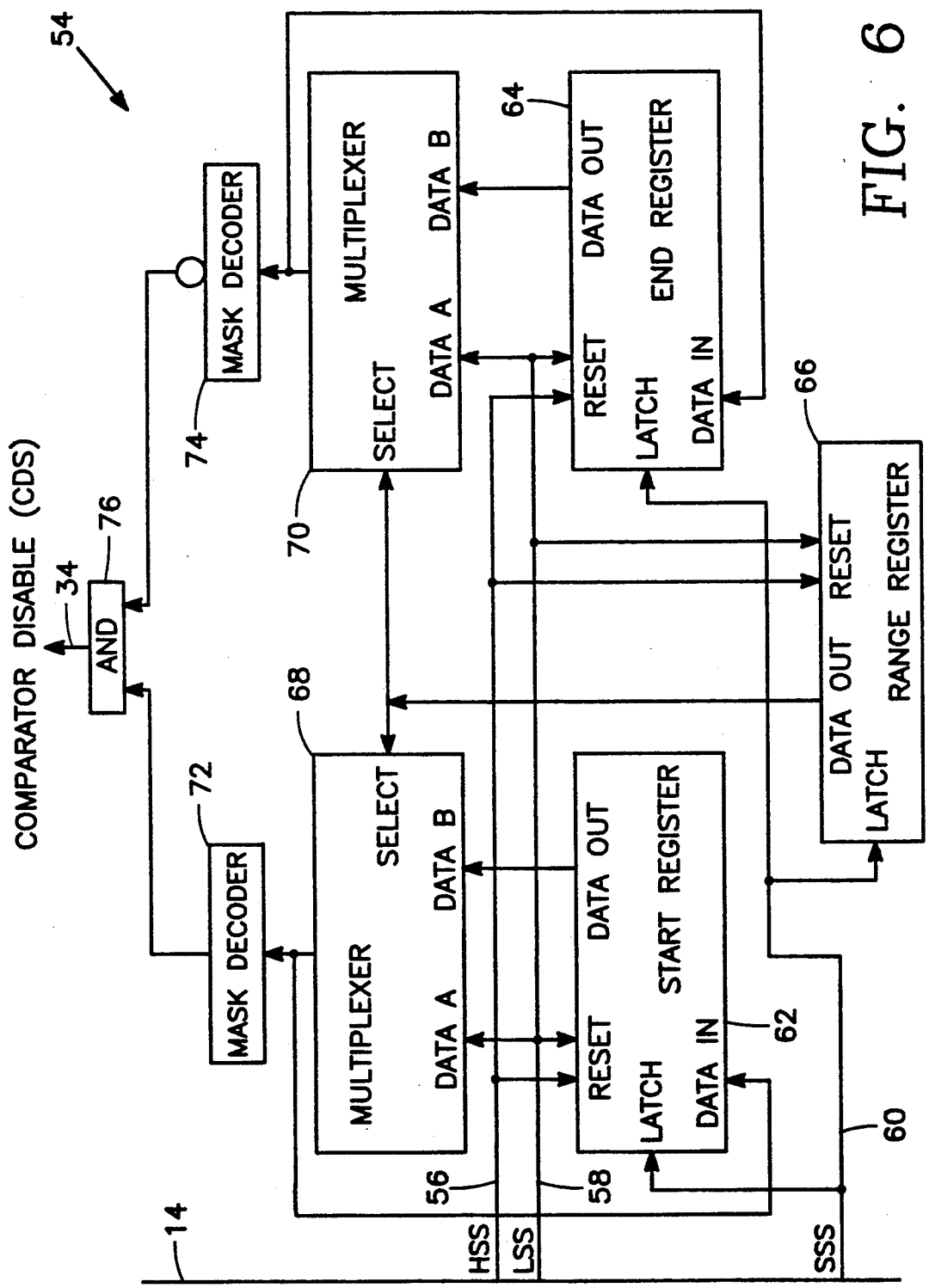
FIG. 6 is a simplified drawing depicting apparatus for implementing the fault isolation algorithms employed in a computer memory according to the present invention.

The masking of the comparators 28 is controlled by the application of appropriate signals on the Comparator Disable Signal (CDS) line 34. Like the CES signals, since there are many rows in the memory chip 12, it is impractical to dedicate one pin for each memory cell's CDS line 34. Accordingly, the Comparator Disable Control Circuit (CDCC) 54 of FIG. 6 is added to each memory chip 12 of the SC/SR 10. The CDCC 54 is controlled by three signals (and thus only requires three pins) from the MIBB 14. The HSS signal on line 56 masks the upper half of the search space, the LSS signal on line 58 masks the lower half of the search space, and the SS signal on line 60 updates the search space. There are three registers in the CDCC 54: a Start Register (SR) 62, an End Register (ER) 64, and a Range Register (RR) 66. The SR 62 points to the beginning of a search space and the ER 64 points to its end. The RR 66 is used to update the range of the search space.

If no latent error is found, the HSS line 56 is set to 0 by the algorithm 42 in the MIBB 14. Additionally, the LSS line 58 is set to 1 and the SSS line 60 is low. Similarly, the SR 62 contains all 0s, the ER 64 contains all 1s, and the RR 66 contains a single 1 in its most significant bit and 0s in all other bits. Each bit in the RR 66 controls the SELECT inputs of a pair of multiplexers 68, 70 at the outputs of corresponding bit positions of SR 62 and ER 64, respectively. If a bit in RR 66 is high, then the HSS line 56 (or the LSS line 58) is selected. Otherwise, the corresponding bit in the SR 62 (or ER 64) is selected. The outputs of the multiplexers 68, 70 are sent to respective ones of a pair of mask decoders 72, 74. Each mask decoder 72, 74 takes a binary number n as input and then generates a logical 0 at the outputs of the 0th bit to the (n−1)th bit and a logical 1 from the nth bit to the last bit. Such mask decoders and their method of operation are, of course, known in the art and, therefore, per se do not form any part of the novelty of this invention. The outputs of the two mask decoders 72, 74 are AND'd together at 76 to form the CDS signal line 34. Thus, the CDS of a row is activated if the output of the mask decoder 72 of the SR 62 is high and the output of the mask decoder 74 of the ER 64 (which is inverted) is low.

When a latent error is detected, the CHIP CEA signal on line 50 is activated and detected by the MIBB 14. The MIBB 14 (i.e. the algorithm 42 thereof) then determines which half of the search space needs to be masked according to the technique described in detail above. If the HS needs to be masked, both HSS 56 and LSS 58 are set to 0. Thus, the output of the SR multiplexer 68 becomes 00...00 and the output of the ER multiplexer 70 becomes 01...11 and, therefore, by the definition of the mask decoders 72, 74 as described above, the CDS from the 0th row to the (N/2−1)th row are active and all other CDSs are inactive. Similarly, if the LS needs to be masked, both HSS 56 and LSS 58 are set to 1 and the outputs of the SR multiplexer 68 the ER multiplexer 70 become 10...00 and 11...11, respectively. Once the MIBB 14 determines which half of the search space should become the next search space, it triggers the SSS signal on line 60 so that outputs of the multiplexers 68, 70 are latched into the SR 62 and the ER 64 and the RR 66 is rotated (i.e. shifted) one position toward the least significant bit.

Eventually, the SR 62 and the ER 64 will contain the same value. At this time, if only one CES signal is active, a Single Error (SE) signal is sent to the MIBB 14. The MIBB 14 then temporarily suspends normal memory operation and sends an Error Correct Signal (ECS) to all the memory chips 12. The response of the memory chips 12 to an ECS is summarized in Table I. On the other hand, if more than one CES is active at the time, the faulty memory chip 12 sends a Multiple Error (ME) signal to the MIBB 14. The MIBB 14 again temporarily suspends normal memory operation and sends an ECS to all the memory chips 12; however, when the faulty memory chip 12 which generated the ME receives the ECS, instead of making the error correction internally, it sends the contents of SR 62 and ER 64 (the row address) and the binary coded position of the CES from line 32 (the column address) via the address bus 78 to the MIBB 14. At this point, the MIBB 14 is able to read out the erroneous word at the indicated address for external correction.

TABLE I

| | Response of Memory Chips to ECS | | |
|---|---|---|---|
| State of Chip | ECS | PRIORITY input | Action |
| no error | H | don't care | No action. |
| SE | H | H | Follow search step of highest priority chips. If single error found in same row as highest priority chip, invert bit with active CES; otherwise, no action. |
| SE | H | L | Communicate with MIBB for error correction (i.e. send CHIP CDA etc.) |
| ME | H | L | Output Row Address (SR or ER) and Column Address (CES position) to address bus. Set PRIORITY output to L. |
| ME | H | H | No action. |

In order to reduce the number of interface signals to the MIBB 14, the SE and ME signal lines of all memory chips 12 in the SC/SR 10 are wire-OR'd together to form a single SE signal line and a single ME signal line. A daisy chain priority is used to resolve contention for attention of the MIBB 14 among the memory chips 12. If more than one memory chip 12 has errors, then the MIBB 14 commands the memory chip 12 at the highest significant bit position to search for its errors first (i.e. the fault isolation procedure is driven by the CHIP CEA signal of the memory chip 12 at the highest significant bit position). Note that all other memory chips 12 can "listen" to the "dialog" of the isolation procedure and can thus follow along the search steps while they wait their turn. When the faulty row in the memory chip 12 at the highest significant bit position is identified, the MIBB 14 commands it to correct its errors. If any other memory chip 12 has a single error in the same row, it can also correct its error internally. If a memory chip 12 does not have an error in this row, no action is taken by that memory chip 12. Similarly, if a memory chip 12 has multiple errors in the row, no action is taken. After all higher priority memory chips 12 have corrected their errors, however, the MIBB 14 will discover the multiple error condition of this memory chip 12 and correct the errors externally. The only situation which will cause system failure is when more than one memory chip 12 has two errors which have exactly the same column and row positions in each of the two chips. As can be appreciated, however, such a situation would be extremely rare under normal circumstances. Were it to take place, the entire memory would probably be in such a state of failure that fault-tolerance and error correction would no longer be practical in any event.

Initial testing by the inventors herein indicates that significant improvement in fault tolerance and error correction can be achieved employing the SC/SR 10 of the present invention. The cost of such self-recovering memory was estimated by comparing VLSI layouts thereof with layouts of conventional memory. It was found that the static implementation of the self-recovering memory cell is about 3.15 times larger than a conventional memory cell and the static-dynamic hybrid implementation is about 2.5 times larger. The cost of self-recovering memory, therefore, is comparable to chip-level triple-modular-redundancy (i.e. voting with three chips). Note, however, that the self-recovering memory of this invention can detect latent faults and isolate them without interrupting system operations or degrading system performance, which is not achievable by chip-level triple-modular-redundancy. Also, as was mentioned earlier, the static implementation of the self-recovering memory cell can be used in simplex mode as two separate conventional memory cells. Thus, the cost of the SC/SR 10 of this invention is not unrealistic in real systems.

Wherefore, having thus described the present invention, what is claimed is:

1. A digital memory chip for use in a random access memory for fault-tolerant computers, said digital memory chip comprising:
   a) a plurality of on-line testable and correctable memory cells, each memory cell comprising a memory sub-cell pair, for holding individually addressable binary bits as pairs of initially duplicate bits in respective memory sub-cell pairs; and,
   b) error detection means incorporated within each memory cell and connected to each memory sub-cell pair thereof and comprising means for continuously sensing the contents of each sub-cell of each memory sub-cell pair and for outputting an error signal whenever a transient error indicated by a difference between the bits of a memory sub-cell pair occurs in the corresponding memory cell.

2. The digital memory chip of claim 1 wherein:
   a) each of said memory sub-cell pairs comprises a pair of static memory sub-cells for simultaneously receiving and holding a common binary data bit written to said memory cell; and,
   b) said error detection means comprises respective comparator means coupled to each memory sub-cell for continuously sensing and comparing the contents of said memory sub-cells of each memory sub-cell pair to one another and for outputting said error signal whenever said contents do not match.

3. The digital memory chip of claim 1 wherein:
   a) each of said memory sub-cell pairs comprises a static memory sub-cell and a dynamic memory sub-cell for simultaneously receiving and holding a common binary data bit written to said memory cell; and,
   b) said error detection means comprises respective comparator means coupled to each memory sub-cell for continuously sensing and comparing the contents of said static memory sub-cell to said dynamic memory sub-cell and for outputting said error signal whenever said contents do not match.

4. The digital memory chip of claim 1 and additionally comprising:
   comparator disable control circuit means connected to said error detection means in respective ones of said memory cells for selectively enabling and disabling said error detection means.

5. The digital memory chip of claim 4 wherein:
   a) each of said error detection means is enabled and disabled by a binary mask word having bit positions thereof corresponding to respective ones of said error detection means; and,
   b) said comparator disable control circuit means comprises means for setting said binary mask word to desired configurations.

6. A fault-tolerant random access memory for use in fault-tolerant computers comprising:
   a) a plurality of memory chips each comprising a plurality of on-line testable and correctable memory cells disposed in rows and columns, each memory cell comprising a memory sub-cell pair, for holding individually addressable binary bits as pairs of initially duplicate bits in respective memory sub-cell pairs; and,
   b) error detection means incorporated within each memory cell and connected to each memory sub-cell pair thereof and comprising means for continuously sensing the contents of each sub-cell of each memory sub-cell pair and for outputting an error signal whenever a transient error indicated by a difference between the bits of a memory sub-cell pair occurs in the corresponding memory cell.

7. The memory of claim 6 wherein:
   a) each of said memory sub-cell pairs comprises a pair of static memory sub-cells for simultaneously receiving and holding a common binary data bit written to said memory cell; and,
   b) said error detection means comprises comparator means coupled to said sub-memory cells for continuously sensing and comparing the contents of said memory sub-cells of each memory sub-cell pair to one another and for outputting said error signal whenever said contents do not match.

8. The memory of claim 6 wherein:
   a) each of said memory sub-cell pairs comprises a static memory sub-cell and a dynamic memory sub-cell for simultaneously receiving and holding a common binary data bit written to said memory cell; and,
   b) said error detection means comprises comparator means coupled to said sub-memory cells for continuously sensing and comparing the contents of said static memory sub-cell to said dynamic memory sub-cell and for outputting said error signal whenever said contents do not match.

9. The memory of claim 6 and additionally comprising:
   comparator disable control circuit means connected to said error detection means in respective ones of said memory cells for selectively enabling and disabling said error detection means.

10. The memory of claim 9 wherein:
   a) each of said error detection means is enabled and disabled by a binary mask word having bit positions thereof corresponding to respective ones of said error detection means; and,
   b) said comparator disable control circuit means comprises means for setting said binary mask word to desired configurations.

11. The memory of claim 10 and additionally comprising:

a) fault detecting logic means connected to respective ones of the memory chips receiving said error signal, for executing an error-isolating algorithm upon receiving a said error signal, and for outputting control signals affecting the content of said mask word; and wherein additionally, b) said means for setting said binary mask word to desired configurations includes means connected to receive said control signals and for setting said binary mask word to configurations indicated by said control signals.

12. The memory of claim 11 wherein:

said fault detecting logic means includes fault correcting logic means for monitoring results of said error-isolating algorithm to determine when and where a error resulting in a said error signal is located and for outputting correction signals to the said memory chip containing said error therein thereby affecting correction of the error on the memory cell level.

13. The memory of claim 11 wherein:

said fault detecting logic means includes fault correcting logic means for monitoring results of said error-isolating algorithm to determine when and where multiple errors on a signal said memory chip resulting in a said error signal are located and for removing erroneous data from the said memory chip containing said error therein, for correcting said erroneous data, and for replacing said erroneous data as corrected from the said memory chip.

14. The memory of claim 11 wherein:

a) said error-isolating algorithm is driven by changes of said error signals; and additionally comprising, b) a plurality of first combining means connected to receive said error signals from respective ones of said memory cells in a column of memory chip for outputting a column error activity (CEA) signal whenever one of said error signals is present in the column associated with a one of said first combining means; and, c) a plurality of second combining means connected to receive CEA error signals from respective ones of said plurality of first combining means for outputting a signal chip CEA signal whenever one of said CEA signals is present on the memory chip associated with a one of said second combining means; and wherein, d) said error-isolating algorithm includes logic to perform the steps of, d1) designating a portion of the memory chip where said comparators are enabled as search space (SS), an upper half of said search space as HS and a lower half as LS, d2) at a beginning of a search, allocating SS as the entire memory chip, d3) at a beginning of fault isolation, masking HS, d4) if the chip CEA signal becomes high (i.e. CES changes from active to inactive) then the error should be in HS, if HS is bigger than one column, masking LS, allocating HS as SS, and returning to step (d3), otherwise going to step (d6), d5) if the chip CEA signal is low (i.e. CES remains active) then the error should be in LS, if LS is bigger than one column, masking HS, allocating LS as SS, and returning to step (d3), otherwise going to step (d6), d6) exiting as the column on the memory chip containing the error has been isolated.

15. The memory of claim 14 and additionally comprising:

a) counter means for counting error corrections made; and wherein, b) said error-isolating algorithm includes non-preferential logic to at step (d3) thereof first masking HS if said counter means is odd and first masking LS if said counter means is even and at step (d6) thereof increment said counter means by one whereby preferential error isolation in either HS or LS is prevented.

16. A memory cell implementable in very large scale integrated circuits for incorporation into memory chips of fault-tolerant computer memories, said memory cell comprising:

a) memory cell means, each memory cell means comprising a memory sub-cell pair, for receiving and holding binary bits as pairs of initially duplicate bits in respective memory sub-cell pairs; and, b) error detection means incorporated into said memory cell means and connected to each memory sub-cell pair thereof and comprising means for continuously sensing the contents of each sub-cell of each memory sub-cell pair and for outputting an error signal whenever a transient error indicated by a difference between the bits of a memory sub-cell pair occurs in the corresponding memory cell means.

17. The memory cell of claim 16 wherein:

a) said memory sub-cell pair comprises a pair of static memory sub-cells for simultaneously receiving and holding a common binary data bit written to said memory cell, whereby one of said sub-cells stores said binary bit and the other of said sub-cells stores a duplicate bit; and, b) said error detection means comprises comparator means coupled to said memory sub-cells for continuously sensing and comparing the contents of said memory sub-cells of each memory sub-cell pair to one another and for outputting said error signal whenever said contents do not match.

18. The memory cell of claim 16 wherein:

a) said memory sub-cell pair comprises a static memory sub-cell and a dynamic memory sub-cell for simultaneously receiving and holding a common binary data bit written to said memory cell; and, b) said error detection means comprises comparator means coupled to said memory sub-cells for continuously sensing and comparing the contents of said static memory sub-cell to said dynamic memory sub-cell and for outputting said error signal whenever said contents do not match.

19. The memory cell of claim 16 and additionally comprising:

comparator disable control circuit means connected to said error detection means in said memory cell means for selectively enabling and disabling said error detection means in response to a control signal.

* * * * *